(12) United States Patent
Wessels et al.

(10) Patent No.: US 11,060,184 B2
(45) Date of Patent: Jul. 13, 2021

(54) EPITAXIAL BARIUM TITANATE THIN FILMS USING A HIGHLY VOLATILE BA(HFA)$_2$ TRIGLYME PRECURSOR

(71) Applicant: Northwestern University, Evanston, IL (US)

(72) Inventors: Bruce W. Wessels, Wilmette, IL (US); Young Kyu Jeong, Gangneung-si (KR)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 15/221,094

(22) Filed: Jul. 27, 2016

(65) Prior Publication Data

US 2017/0029943 A1 Feb. 2, 2017

Related U.S. Application Data

(60) Provisional application No. 62/197,392, filed on Jul. 27, 2015.

(51) Int. Cl.
| | |
|---|---|
| *C23C 16/18* | (2006.01) |
| *C30B 25/02* | (2006.01) |
| *C30B 29/32* | (2006.01) |
| *C23C 16/455* | (2006.01) |
| *C23C 16/46* | (2006.01) |

(52) U.S. Cl.
CPC ............ *C23C 16/18* (2013.01); *C23C 16/455* (2013.01); *C23C 16/46* (2013.01); *C30B 25/02* (2013.01); *C30B 29/32* (2013.01)

(58) Field of Classification Search
None
See application file for complete search history.

(56) References Cited

U.S. PATENT DOCUMENTS

2003/0124251 A1* 7/2003 Onozawa .............. C23C 16/409
427/255.28

FOREIGN PATENT DOCUMENTS

| | | |
|---|---|---|
| EP | 0814062 B1 | 12/1997 |
| WO | 9814322 A1 | 4/1998 |

OTHER PUBLICATIONS

Towner et al "Three dimensional domain structure in epitaxial barium titanate thin films" Jol of Electroceramics 13, 89-93, 2004.*
Rollett et al "Microstructure properties Lecture 1: Microstructure measurement" published on Aug. 2015; accessed online Jan. 4, 2020 (Year: 2015).*
Voort, George Vander, Areo Vac "Measurement of the volume fraction of beta phase in naval brass" published on Jul. 1, 2015; accessed online Jan. 4, 2020 (Year: 2015).*
Maison et al. "Effect of calcination teperature on phase transformation and particle size of barium titanate fine powders synthesized by the catecholate process." ScienceAsia 27 (2001) p. 239-243 (Year: 2001).*

(Continued)

*Primary Examiner* — Mandy C Louie
(74) *Attorney, Agent, or Firm* — Locke Lord LLP; Tim Tingkang Xia, Esq.

(57) ABSTRACT

Ferroelectric barium titanate (BaTiO$_3$) epitaxial films grown by metal-organic chemical vapor deposition using a barium precursor having a low melting point and a stable vapor pressure.

22 Claims, 7 Drawing Sheets

(56) References Cited

OTHER PUBLICATIONS

Dhote, A.M., "Low temperature deposition of epitaxial BaTiO 3 BaTiO3 films in a rotating disk vertical MOCVD reactor", J. Vac. Sci. Technol. B 23, 1674 (2005).
Hinds, Bruce J. et al., "Thin films for superconducting electronics: Precursor performance issues, deposition mechanisms, and superconducting phase formation-processing strategies in the growth of Tl2Ba2CaCu2O8 films by metal-organic chemical vapor deposition", J. Mater. Res. 12, 1214 (1997).
Towner, D.J. et al, "Effects of two-stage deposition on the structure and properties of heteroepitaxial BaTiO3 thin films", J. Cryst. Growth 205, 107 (2003).
Belot, John A., et al., "Volatility by Design. Synthesis and Characterization of Polyether Adducts of Bis(1,1,1,5,5,5-hexafluoro-2,4-pentanedionato)barium and Their Implementation as Metal-Organic Chemical Vapor Deposition", Chem. Mater. 9, 1638 (1997).
Makarevich et al., "A Novel Dimeric Complex of Barium Bis(hexafluoroacetylacetonate) with Triglyme: Synthesis, Structures, and Volatility", Doklady Chemistry, 2013, 451, 181-184.
Meier et al., "Integration of BaTiO3 on Si (0 0 1) using MgO/STO buffer layers by molecular beam epitaxy", Journal of Crystal Growth 294, 2006, 401-406.
Chiba et al., "Deposition of BaTiO 3 thin films by plasma MOCVD", Thin Solid Films 300, 1997, 6-10.
International Search Report and Written Opinion for PCT/US2016/044299 dated Oct. 21, 2016, 13 pages.

\* cited by examiner

EPITAXIAL BARIUM TITANATE THIN FILMS USING A HIGHLY VOLATILE BA(HFA)$_2$ TRIGLYME PRECURSOR

The application claims priority to and the benefit of application Ser. No. 62/197,392 filed Jul. 27, 2015—the entirety of which is incorporated herein by reference.

This invention was made with government support under ECCS-1201853 and DMR-1121262 awarded by the National Science Foundation. The government has certain rights in the invention.

BACKGROUND OF THE INVENTION

Ferroelectric thin films have attracted a great deal of interest owing to their potential for new generation of electronic and electro-optic devices. Among numerous ferroelectrics currently under investigation, barium titanate (BaTiO$_3$) has been extensively studied because of its high dielectric constant, which make it attractive for non-volatile memory devices such as a ferroelectric random access memory (FRAM). In addition, BaTiO$_3$ (BTO) exhibits a large nonlinear optical response superior to those of most other materials and forms the basis of prototype optical waveguides and electro-optic modulators for advanced optical systems.

High quality epitaxial layers are required for thin film electro-optic devices to provide low optical loss and a large electro-optic coefficient. To obtain high quality epitaxial films, several thin film deposition techniques have been developed, including molecular beam epitaxy, pulsed laser deposition, and metal-organic chemical vapor deposition (MOCVD). Among them, MOCVD provides advantages of compositional control, high throughput, and the potential to grow on large wafer sizes. (A. M. Dhote, A. L. Meier, D. J. Towner, B. W. Wessels, J. Ni, and T. J. Marks, *J. Vac. Sci. Technol.* B 23, 1674 (2005).) For MOCVD growth, highly volatile and stable metal-organic precursors are required. A widely used precursor for barium in BTO is Ba(dpm)$_2$, where dpm is dipivaloylmethanate. To achieve high deposition rates, however, this precursor must be heated to temperatures approaching the decomposition temperature (~240° C.). Decomposition can reduce vapor pressure of the desired precursor. Moreover, electropositive metals with large ionic radii and coordination numbers, such as Ba$^{2+}$ ions, are difficult to coordinately saturate without forming involatile oligomers—also leading to low vapor pressure, slower reaction rates and diminished yield. (B. J. Hinds, R. J. McNeely, D. B. Studebaker, T. J. Marks, T. P. Hogan, J. L. Schindler, C. R. Kannewurf, X. F. Zhang, and D. J. Miller, *J. Mater. Res.* 12, 1214 (1997).)

SUMMARY OF THE INVENTION

In light of the foregoing, it is an object of the present invention to provide epitaxial barium titanate thin films and method(s) for their production, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It can be an object of the present invention to provide metal-organic precursor components of such films which sublime at relatively low temperatures to avoid decomposition thereof.

It can be another object of the present invention to reduce precursor oligomerization and stabilize precursor vapor pressure.

It can be an object of the present invention, alone or in conjunction with one or more of the preceding objectives, to provide enhanced thin film deposition rates, as compared to the prior art, and epitaxial, polydomain ferroelectric thin film structures resulting therefrom.

Other objects, features benefits and advantages of the present invention will be apparent from this summary and the descriptions of various embodiments, and will be readily apparent to those skilled in the art having knowledge of epitaxial thin film structures and methods for their preparation. Such objects, features, benefits and advantages will be apparent from the above as taken into conjunction with the accompanying examples, data, figures and all reasonable inferences to be drawn therefrom.

In part, the present invention can be directed to a method of metal-organic chemical vapor deposition. Such a method can comprise providing barium triglyme and titanium tetraisopropoxide precursor components, and a substrate; heating each such precursor component at a pressure sufficient to provide a medium comprising a vapor of each such component, with each component vapor at a concentration and pressure sufficient for chemical reaction; introducing oxygen to such a vapor medium; deposition and chemical reaction of such vapor medium components on such a substrate to provide an epitaxial barium titanate film thereon, such a film having a first thickness dimension and comprising an a-domain structure; and continued such deposition and chemical reaction to provide such an epitaxial barium titanate film having a second thickness dimension and comprising a mixed a- and c-domain structure.

In certain embodiments, such a barium precursor component can be heated at a temperature less than about 120° C., preferably, at a temperature at or above the melting point of such a component. Regardless, initial film deposition can be accomplished at a temperature of or about 750° C., then continued deposition and growth at a temperature of or about 850° C. Without limitation, a growth rate of about 150 nm per hour can be accomplished.

In part, the present invention can also be directed to a method of metal-organic chemical vapor deposition. Such a method can comprise providing barium triglyme and titanium tetraisopropoxide precursor components, and a substrate in an MOCVD apparatus comprising an external bubbler component and a reactor component, such a substrate as can be in such a reactor component; heating each precursor component at a pressure sufficient to provide a medium comprising a vapor of each such component; transporting each such precursor vapor to such a reactor component with a carrier gas generated by such an apparatus; introducing oxygen to the precursor vapors; deposition and chemical reaction of such vapor components on such a substrate to provide an epitaxial barium titanate film thereon, such a film having a first thickness dimension and comprising an a-domain structure; and continued said deposition and chemical reaction to provide such an epitaxial film having a second thickness dimension and comprising a mixed a- and c-domain structure. In certain such embodiments, such a barium precursor component can be heated at temperatures of the sort discussed above or illustrated elsewhere herein. Regardless, initial film deposition, continued deposition and film growth can be accomplished at respective temperatures of the sort discussed above and illustrated elsewhere herein. Without limitation, a growth rate of about 150 nm per hour can be realized.

In part, the present invention can also be directed to a method of using barium titanate film thickness to reduce tensile strain. Such a method can comprise providing barium triglyme and titanium tetraisopropoxide precursor components, and a substrate; heating each such precursor component at a pressure sufficient to provide a medium comprising a vapor of each such component, with each component vapor at a concentration and pressure sufficient for chemical reaction; introducing oxygen to such a vapor medium; deposition and chemical reaction of such vapor medium components on such a substrate to provide an epitaxial barium titanate film thereon, such a film having a first thickness dimension and comprising an a-domain structure and a first tensile strain; and continued such deposition and chemical reaction to provide such an epitaxial barium titanate film having a second thickness dimension and comprising a mixed a- and c-domain structure and a second tensile strain relaxed by comparison with such a first tensile strain.

In certain embodiments, such a barium precursor component can be heated at a temperature less than about 120° C., preferably, at a temperature at or greater than about the 103° C. melting point of such a component said temperature sufficient to provide a stable vapor pressure without molecular oligomerization. Regardless, initial film deposition can be accomplished at a temperature of or about 750° C., then continued growth at a temperature of or about 850° C. Without limitation, a growth rate of about 150 nm per hour can be accomplished.

In part, the present invention can also be directed a method of using film thickness to increase piezoelectric response of a barium titanate film deposited as described herein or, alternatively, to increase saturation polarization of such a barium titanate film. Such method(s) can be as described above, providing a reduced first film thickness.

With reference to any one or more of the preceding embodiments, barium and titanium precursor components can be introduced into an MOCVD apparatus. In certain such embodiments, such an apparatus can comprise Ba and Ti external bubbler components.

As would be understood by those skilled in the art, a precursor gas component can be generated by a corresponding bubbler component of such an apparatus. A carrier gas (e.g., argon) can be bubbled through the metal organic liquid, whereby such a gas picks up vapor and transports it to a reactor component. Amount and/or concentration of vapor(s) is dependent upon rate of carrier flow and bubbler temperature.

DETAILED DESCRIPTION OF CERTAIN EMBODIMENTS.

As demonstrated below, to illustrate certain non-limiting embodiments, a Ba(hfa)$_2$.polyether complex, where hfa is hexafluoroacetylacetonate, was used as a Ba precursor. To increase the volatility and minimize molecular oligomerization, the metal coordination sphere was saturated with sterically hindered (triglyme) and (hfa)-ligands. The precursor Ba(hfa)$_2$.triglyme has a relatively low melting point of ~103° C., exhibits a stable vapor pressure, and transports Ba at lower temperatures than prior art Ba(dpm)$_2$. Furthermore, the synthesis of this precursor is very simple, safe and air-insensitive compared to other Ba(hfa)$_2$.polyether series, such as Ba(hfa)$_2$.pentaethylene glycolethylbutylether [Ba(hfa)$_2$.PEB]. Syntheses of these precursors are well-known to those skilled in the art and have been provided in the literature.

Barium titanate films were deposited by MOCVD using the barium precursor, Ba(hfa)2.triglyme. Epitaxial barium titanate films with a polydomain ferroelectric structure were deposited at temperature from about 750° C.-about 850° C. The ferroelectric domain structure was shown to depend on film thicknesses as determined by a high-resolution X-ray. Films with a thickness of greater than 300 nm have a mixed domain structure comprising a- and c-oriented domains.

Figure 1A:
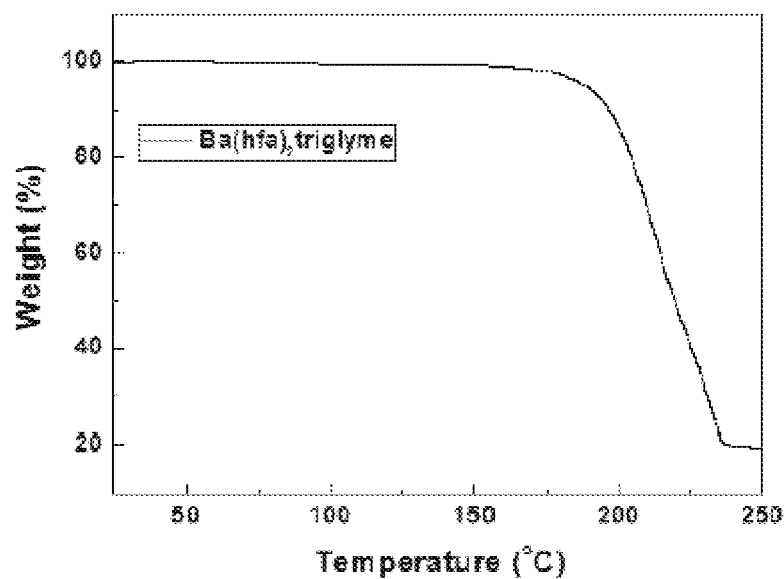
FIGS. 1A-B. (A) Weight loss data for the reduced pressure TGA of the precursor, Ba(hfa)2.triglyme, at 5 Torr. (B) Isothermal data (weight loss with respect to time) of the precursor collected at 110° C.
Figure 1B:
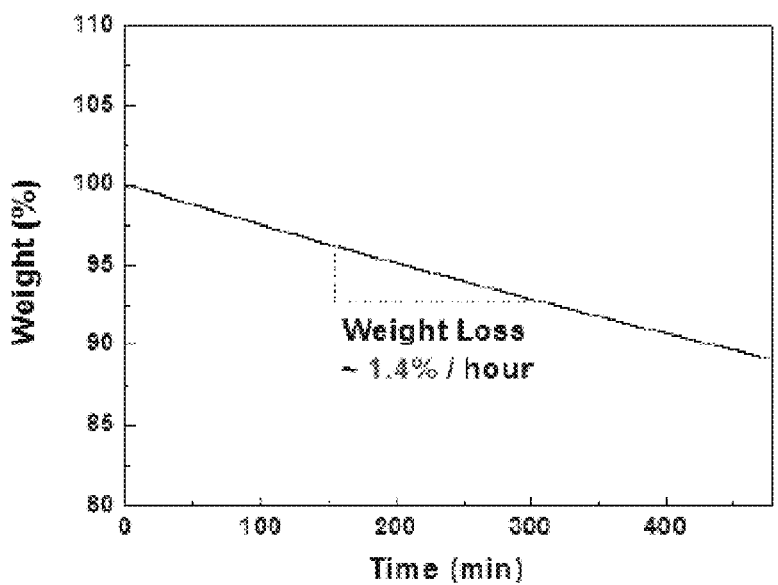

Reduced-pressure TGA was performed to examine transport characteristics of the Ba(hfa)$_2$.triglyme precursor. FIG. 1(A) shows the raw TGA-derived weight loss data under 5 Torr. The reduced pressure of 5 Torr in this measurement is nearly the same as the working pressure in the reactor during the growth, thus giving a determination of precursor sublimation rate under growth conditions. The weight loss curve clearly shows that the precursor remains almost stable up to 150° C., but it undergoes a marked weight loss above this temperature. FIG. 1(B) shows the isothermal analysis recorded at 110° C. In this graph, sublimation with a 1.4% weight loss after 500 min was observed. Moreover, the curve slope becomes almost constant during the whole measurement, thus indicating that the sublimation process is steady and stable at 110° C. It will be understood by those skilled in the art the vapor of a barium precursor component can be provided through sublimation thereof and/or vaporization of a liquefied precursor component under MOCVD apparatus operating conditions.

Figure 2A:
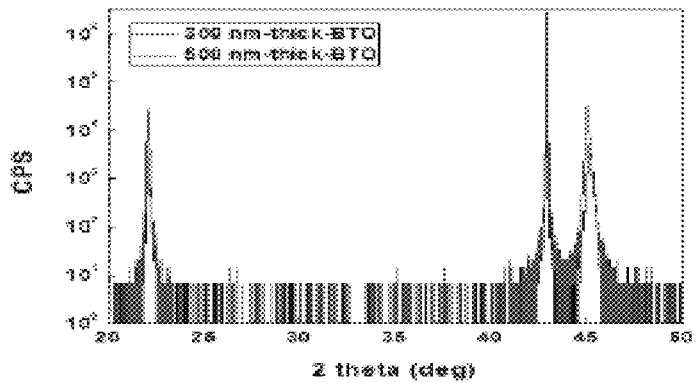
FIGS. 2A-C. (A) High resolution theta-2theta (θ-2θ) X-ray diffraction (XRD) patterns of the 300 nm-thick and 500-nm-thick BaTiO$_3$ thin films. (B) The epitaxial growth was confirmed by examining the in-plane XRD phi-scans. These patterns were obtained by keeping the Bragg angle at (111) orientation for both the BaTiO$_3$ film and the MgO substrate. (C) The in-plane FWHM of rocking curve at the BaTiO$_3$ (200) plane, is 0.5° for the 300 nm-thick film, 0.4° for the 500 nm-thick film.
Figure 2B:
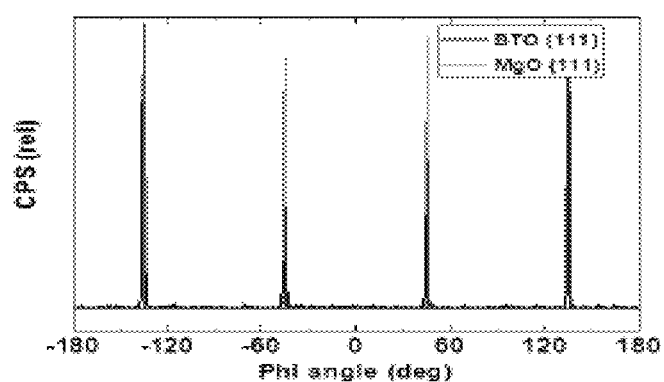
Figure 2C:
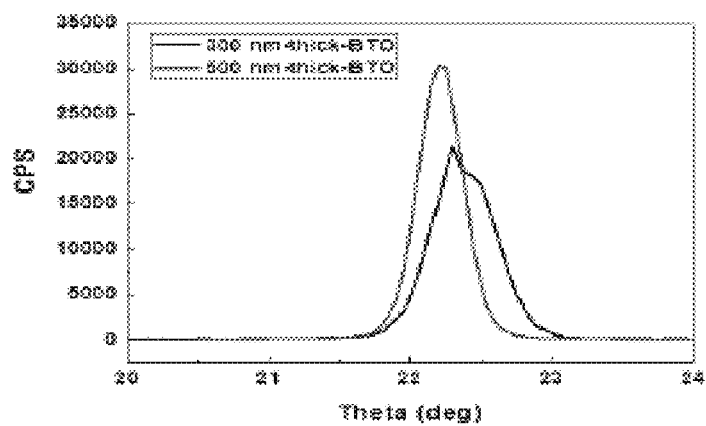

FIG. 2(A) shows the X-ray diffraction (XRD) patterns of a 300 nm and a 500 nm thick BTO films grown on the MgO (100) substrates. No trace of impurity phases, such as $BaF_2$, was observed. Both the XRD patterns show two strong diffraction peaks: one at 2θ=22° from BTO (100) and the other at 2θ=45° from BTO (200), indicating that the BTO layers are preferentially oriented along [100] direction. This is due to tensile strain arising from the lattice mismatch between BTO and MgO (100). As shown in FIG. 2(B), the heteroepitaxial growth of BTO was confirmed by measuring the in-plane XRD phi-scans. The phi-scan pattern on the BTO (111) layer is characterized by a fourfold symmetry and matches well with that of the MgO substrate for the (111) orientation, as expected in tetragonal structures. Thus, the BTO layer has a single in-plane orientation and shows a heteroepitaxial relationship with the MgO (100) substrate. In addition, the film crystallinity normal to the plane of sample surface was determined from the rocking curve of the (200) BTO peak, as shown in FIG. 2(C). The full width at half maximum (FWHM) of the (200) BTO reflection is 0.5° for the 300 nm-thick film, and 0.4° for the 500 nm-thick film, indicating good crystallinity.

Figure 3A:
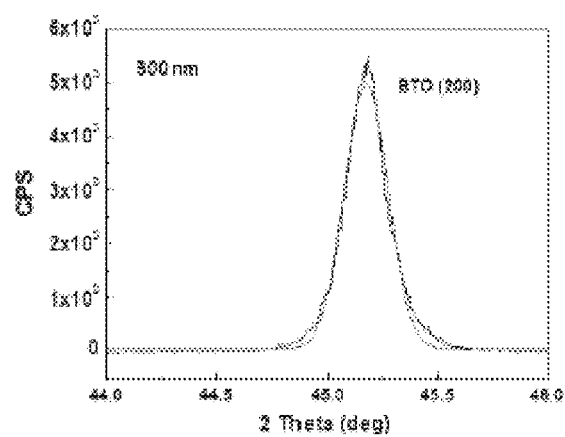
FIGS. 3A-B. (A) θ-2θ X-ray diffraction scan of the BaTiO$_3$ (200) peak in the 300 nm-thick-film. Note that only one peak is attributed to the a-domain structure. (B) Diffraction data of the BaTiO$_3$ (002)/(200) peak in the 500 nm-thick-film. The peak is resolved into the sum of two Gaussian curves. Integrating the area of each curve and weighting for X-ray scattering intensity enable determination of the volume fraction of each domain type present in this sample.
Figure 3B:
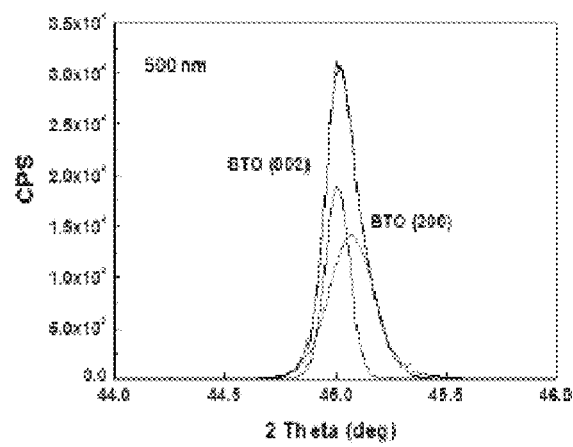

Further analysis of the X-ray diffraction pattern indicate a tetragonal split of (002)/(200) $BaTiO_3$ peak with increasing thickness. The two theta peak centered at 2θ=45° was resolved using a Gaussian function for the 300 nm-thick and the 500 nm-thick BTO films. FIG. 3B shows that the peak was split having peaks at 2θ=45.02° [for (002), c-domain] and 45.13° [for (200), a-domain] in the 500 nm thick film, where an intensity (i.e., CPS—counts per second) of said peak at 2θ=45.02° for (002) c-domain is greater than that of said peak at 2θ=45.13° for (200) a-domain. There exists, however, only one peak at 2θ=45.17° [for (200), a-domain] in the 300 nm thick film as shown in FIG. 3A. The results indicate that the tensile strain incorporated in the BTO film still persists up to the thickness of 300 nm, thus in this case the a-domain structure is stabilized. However, as the thickness further increases, the tensile strain relaxes by creating a mixed c-domain structure. The volume fraction was estimated as 57:43 (%) for the a and c-domains, respectively, by integrating the area of each fitted curve.

Figures 4A, 4B:
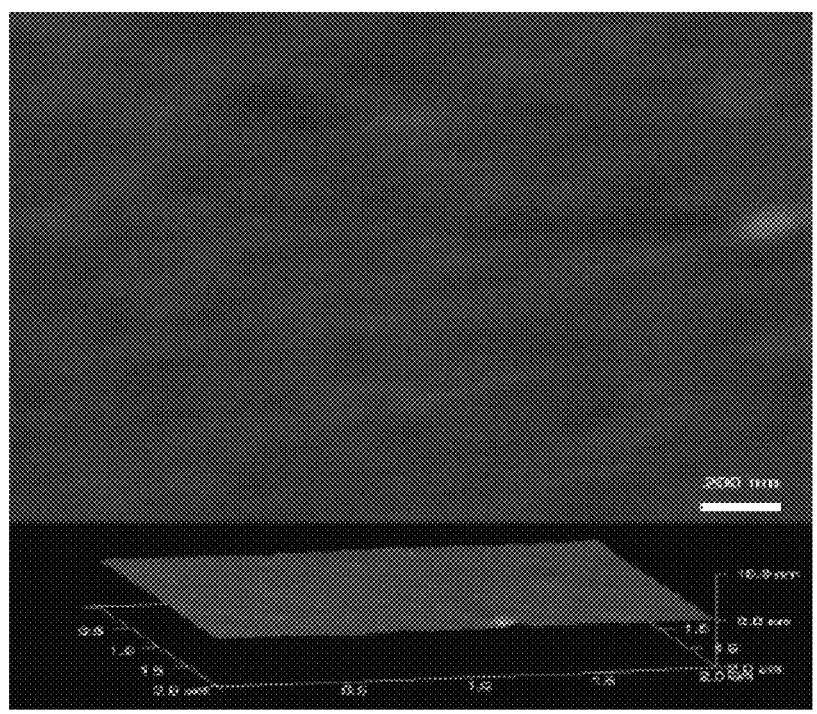
FIGS. 4A-B. AFM deflection mode digital images of a 500 nm-thick-BTO film having an RMS roughness of 0.4 nm; two-dimensional plane view (A) and three-dimensional image (B). The scan area is 2 μm×2 μm and the z-range is 20 nm.

For optical applications of the BTO films, a smooth surface is desired because large optical losses may result from surface scattering. The surface morphology of the BTO film grown on the MgO substrate was examined using AFM. The two dimensional and three dimensional surface images of the AFM deflection mode in the 500-nm-thick BTO film are shown in FIG. 4. The root mean square (RMS) roughness was estimated to 1.8 nm in the scan area of 2 µm by 2 µm. The grain size ranges from less than 20 nm to as large as 50 nm. For smoother regions of the film surface, a RMS roughness as low as 0.4 nm is measured, indicating this film has a reasonably flat surface and is suitable for waveguide applications.

Figure 5A:
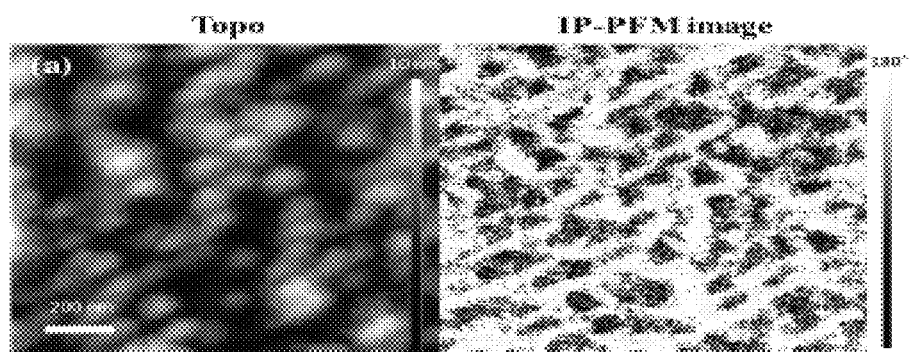
FIGS. 5A-B. Digital images for topographies and IP-PFM phases obtained in the same regions of the (A) 300 nm-thick and (B) the 500 nm-thick BTO film, respectively. The 300-nm-thick BTO film exhibits clear contrast difference in the IP-PFM signal, while very weak response is observed in the 500-nm-thick film.
Figure 5B:
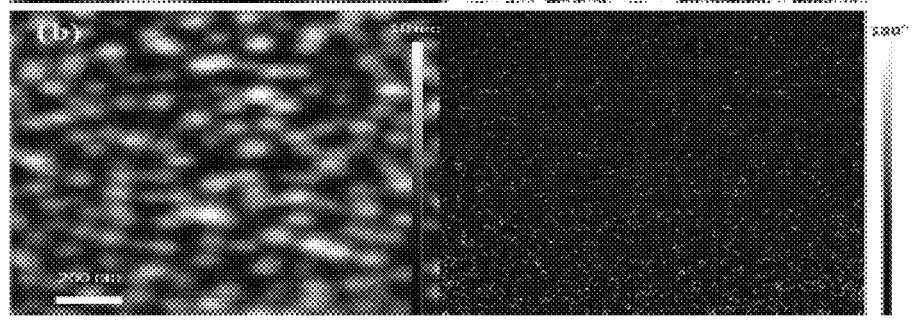

To investigate the thickness-dependent piezoelectric response and ferroelectric domain structure of the BTO film grown on MgO substrate, a piezoelectric force microscopy (PFM) technique was used. FIG. 5 shows the topographies and in-plane (IP) PFM phases of the two samples obtained without applying any dc voltage. When applying an electric field to the BTO films, ferroelectric domains whose polarization is parallel to the field can be flipped whereas domains whose polarization is orthogonal to the field keep their polarization state. During the PFM measurements, the applied electric field is parallel to the surface of the samples, resulting in a different PFM response between the 300-nm-thick and the 500-nm-thick BTO films. FIG. 5(A) displays topographic and IP-PFM phase images of the same region in the 300-nm-thick BTO film, showing contrast difference in the IP-PFM response. This indicates that the tensile strain incorporated between the film and the substrate stabilized the a-axis domain, subsequently allowing ferroelectric domains respond to the in-plane electric field with the clear IP-PFM image. According to the structural analysis in the FIG. 2, however, the tensile strain is relaxed in order to reduce the lattice mismatch and the c-domain begins to grow as film thickness increases. Interestingly, the PFM response is very weak in the 500-nm-thick BTO film compared to the relatively thinner film, as shown in FIG. 5(B). The ferroelectric c-domain requires an electric field perpendicular to the film surface to flip its polarization, which is not available during the in plane-PFM measurements. Therefore, the weak response can be attributed to the presence of c-domains, which is consistent with the XRD results for the 500 nm film.

Figure 6:
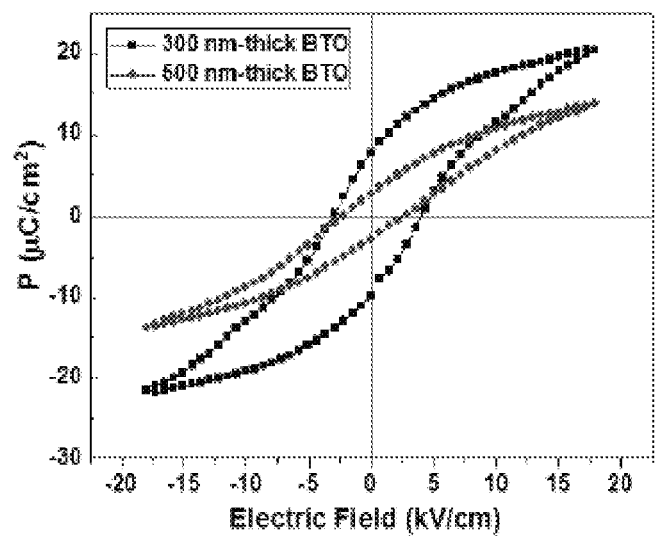
FIG. 6. Room-temperature ferroelectric hysteresis loops in the 300 nm-thick and 500 nm-thick BTO films. The hysteresis loop measured in the 300 nm-thick film shows a nearly saturated P-E loop with a relatively higher remnant polarization. The loop measured in the 500 nm-thick film is unsaturated with a lower remnant polarization.

In order to support the dependence of domain structure on film thicknesses, the polarization versus electric field (P-E) curves were measured at room temperature for the two BTO films grown on the MgO (100) substrate, as presented in FIG. 6. The electric field was applied between two coplanar gold electrodes on the film surface with a measuring frequency of 66 Hz. The hysteresis loop measured in the 300 nm-thick-BTO film shows a nearly square-shaped and saturated loop. The loop measured, however, in 500 nm-thick-BTO film exhibits a narrow and unsaturated loop. For the 300 nm-thick-BTO film, the saturation polarization (Ps) was 20 µC/cm² and the remnant polarization obtained from the P-E hysteresis loop is 7.5 µC/cm² with the coercive field (Ec) of 4.5 kV/cm. For the 500 nm film, Ps reduced to 12 µC/cm². The reduction in the 500 nm film results from the mixed a/c domain structure.

EXAMPLES OF THE INVENTION

The following non-limiting examples and data illustrate various aspects and features relating to the methods, resulting epitaxial thin films and related thin film-substrate composites of the present invention, including the preparation of polydomain ferroelectric barium titanate thin films, as are available through the methodology described herein. In comparison with the prior art, the present methods, epitaxial thin films and resulting composites provide results and data which are surprising, unexpected and contrary thereto.

Example 1

Figure 7:
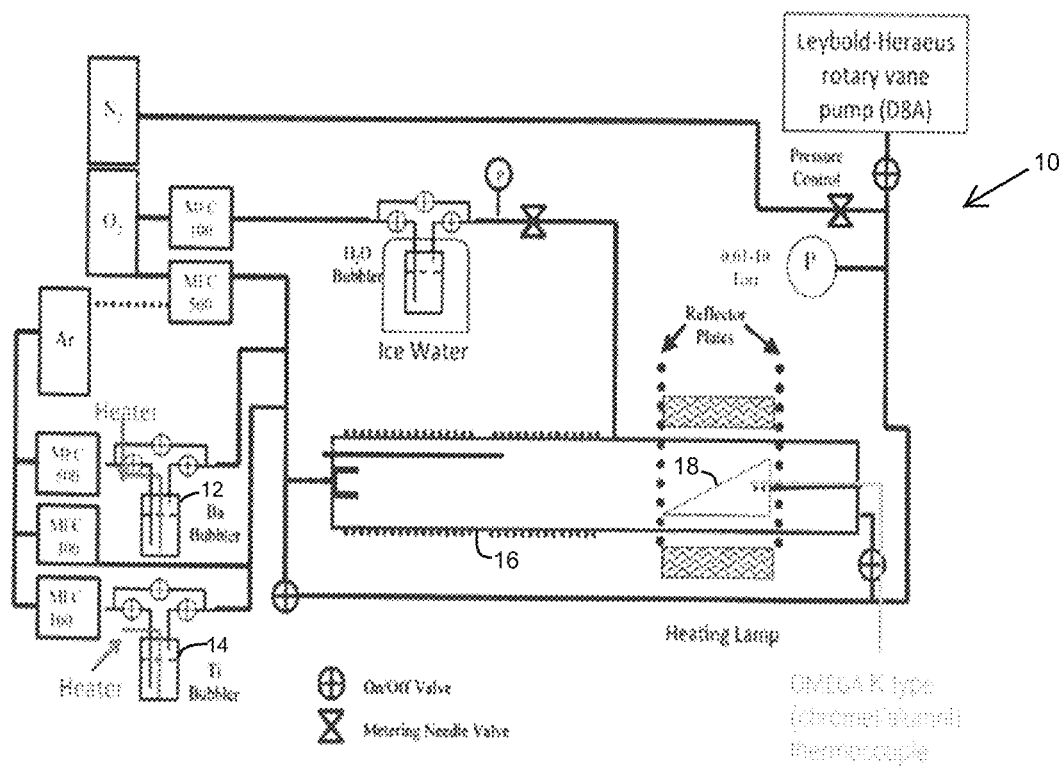
FIG. 7. A schematic illustration of an MOCVD apparatus/system 10 of the sort which can be used in conjunction with the present invention, showing external Ba and Ti bubblers 12 and 14, reactor 16 and substrate 18, together with a mass flow controller (MFC) or multiples thereof as needed.

BTO thin films were epitaxially grown on MgO (100) substrates by low pressure MOCVD in a horizontal cold wall quartz reactor of MOCVD apparatus 10 (FIG. 7). Two metalorganic precursors, i) titanium tetraisopropoxide (TTIP, 99.999% purity) ii) $Ba(hfa)_2$.triglyme, were employed as source materials for Ti and Ba and maintained at 50° C. and 110° C. during the deposition, respectively. The volatility and thermal stability of the $Ba(hfa)_2$.triglyme precursor were characterized in the reduced pressure with a thermogravimetric analysis (TGA) apparatus. High purity Ar was used as the carrier gas. The oxidant was ultra-high purity oxygen. All metal-organic precursors and the oxidizing agent were delivered with an Ar carrier gas. Gas lines were maintained above the melting point of the Ba precursor (103° C.) to prevent condensation of precursors. The oxygen flow rate of 225 sccm resulted in a partial pressure of 2.8 Torr, with a system pressure of ~5 Torr. Carrier gas flow rates were 125 and 35 sccm for the Ba and Ti precursors. The TTIP line employed a 60 sccm dilutant flow between the bubbler and the reactor.

Example 2

For the BTO (100) on MgO (100) hetero-epitaxial system, the lattice mismatch is ~5% at growth temperatures, which potentially results in highly strained films. Surface roughness can be affected by growth instabilities due to the large lattice mismatch strain between film and substrate. To minimize instabilities, a two-stage growth process was employed to improve BaTiO$_3$ film crystallinity and surface roughness. (D. J. Towner, J. Ni, T. J. Marks, and B. W. Wessels, *J. Cryst. Growth* 205, 107 (2003).) A nucleation layer was initially grown at low temperature (750° C.), and then the substrate was ramped up to growth at a temperature (850° C.). The growth rate is ~150 m/hour.

Example 3

For structural characterization of the BTO films including phase purity, epitaxy, and crystallinity, high-resolution x-ray diffraction patterns were obtained using a four-circle X-ray diffractometer with Cu K$\alpha_1$ radiation (Rigaku ATX-G thin film diffractometer). The surface morphology of the film was imaged with an atomic force microscope (AFM, Dimension Icon, Bruker). In-plane ferroelectric response was analyzed by measuring polarization versus electric-field hysteresis curves using a ferroelectric measurement apparatus (RT6000S, Radiant Technology). For this measurement, two coplanar gold electrodes were deposited on the film surface along (100) direction. Piezoelectric force microscopy (PFM) was used to image the thickness dependence on the ferroelectric domain structures in the BTO films.

Example 4

Barium precursor compounds are prepared in accordance with the synthetic techniques described in J. A. Belot, D. A. Neumayer, Ch. J. Reedy, D. B. Studebaker, B. J. Hinds, Ch. L. Stern, and T. J. Marks, *Chem. Mater.* 9, 1638 (1997), the entirety of which is incorporated herein by reference, and as provided below, generally, for barium-polyether adducts (Examples 4a and 4b) and, more specifically, for a barium-triglyme adduct (Example 4c). TTIP is commercially available; e.g., from Sigma-Aldrich.

Example 4a

Typical Ba(hfa)$_2$.polyether Synthesis in Toluene (Method A). Under N$_2$, 0.0063 mol of polyether is added to a stirring suspension of 0.0063 mol of Ba(hfa)$_2$ and 50 mL of heptane. The reaction mixture is stirred for 2 h, the volatiles are removed in vacuo, and the product is dried in vacuo overnight (10$^{-2}$ Torr). The solid is then transferred to a sublimer (equipped with an ice-chilled water coldfinger), evacuated (<10$^{-4}$ Torr), and heated until sublimation began.

Example 4b

Typical Ba(hfa)$_2$.polyether Synthesis in Water (Method B). In a 1-L round-bottom flask fitted with an addition funnel, 14.9 g (0.0570 mol) of 99.999% Ba(NO$_3$)$_2$ and 1.00 equiv of the desired glyme are dissolved in 200 mL of distilled, deionized water. Simultaneously, 2.00 equiv of H(hfa) and 100 mL of DMF are placed in a 500 mL Erlenmeyer flask, and 2.00 equiv of n-PrNH$_2$ is slowly added (in 0.5 mL increments). The bright yellow n-PrNH$_3{}^+$hfa$^{31}$ solution is then transferred to the addition funnel and added dropwise to the Ba$^{2+}$ solution at a rate of 1 drop/s. Following the addition, the reaction mixture is stirred for 1 h, and the solids are collected by suction filtration on a fritted glass funnel, washed twice with 50 mL of distilled deionized water, and then dried in vacuo. The products are then sublimed in vacuo (pressure≤10$^{-4}$ Torr; coldfinger cooled with recirculating water at 0° C.), or recrystallized from heptane for X-ray analysis, to yield the Ba-(hfa)$_2$.polyether complexes as analytically pure, colorless crystalline materials.

Example 4c

Ba(hfa)$_2$.triglyme.H$_2$O. In a 500-mL round-bottom flask 4.6 g (0.017 mol) Ba(NO$_3$)$_2$ is dissolved in 4.7 g (0.026 mol) triglyme, 100 mL of DMF, and 10 mL of distilled H$_2$O. Simultaneously, a 500 mL Erlenmeyer flask is charged with 100 mL of DMF, 7.3 g (0.035 mol) of H(hfa), and 2.2 g (0.037 mol) of n-PrNH$_2$ (added to the hfa/DMF with rapid stirring). The n-PrNH$_3{}^+$hfa$^-$solution is then transferred to the stirring Ba(NO$_3$)$_2$ solution, the reaction allowed to continue for 1 h and filtered, and the filtrate reduced to a yellow slurry in vacuo. The slurry is then poured into 100 mL of distilled H$_2$O, agitated, and filtered (this procedure is repeated thrice). The solids are air-dried overnight and sublimed (120° C./0.05 Torr) yielding 6.11 g (47%) of colorless product.

As demonstrated by the preceding, ferroelectric BTO films were grown using a new Ba precursor Ba(hfa)$_2$.triglyme by low pressure metal-organic chemical vapor deposition. It is experimentally shown that tensile strain arising from the lattice mismatch between BTO and the MgO (100) orientation substrate is mainly responsible for the domain structures in the BTO films. Based on the XRD patterns, the a-domain structure is dominant up to the film thickness of ~300 nm. As the thickness further increases, however, the tensile strain is relaxed by creating the complex a and c-domain structure. The IP-PFM measurements and observed ferroelectric hysteresis loops support the thickness-dependent strain relaxation and the domain structure change in the BTO thin film.

We claim:

1. A method of metal-organic chemical vapor deposition (MOCVD), said method comprising:
providing barium(hexafluoroacetylacetonate)$_2$.triglyme.H$_2$O and titanium tetraisopropoxide precursor components, and a substrate in an MOCVD apparatus;
heating each said precursor component at a pressure sufficient to provide a medium comprising a vapor of each said component, each said component vapor at a concentration and pressure sufficient for chemical reaction;

introducing oxygen to said vapor medium;

deposition and chemical reaction of said vapor medium components on said substrate to provide an epitaxial barium titanate film on said substrate, said film having a first thickness dimension and comprising an a-domain structure; and continued said deposition and chemical reaction to provide said epitaxial barium titanate film having a second thickness dimension and comprising a mixed a- and c-domain structure;

wherein two theta peak is split having peaks at 2θ=45.02° for (002) c-domain and 2θ=45.13° for (200) a-domain when the thickness of said epitaxial barium titanate film is about 500 nm, and an intensity of said peak at 2θ=45.02° is greater than that of said peak at 2θ=45.13°;

wherein said epitaxial barium titanate film has a ratio of volume fractions of the a-domain and c-domain being 57:43 (%); and wherein said epitaxial barium titanate film has a root mean square roughness substantially between 0.4 nm to 1.8 nm.

2. The method of claim 1 wherein said barium precursor component is heated at a temperature less than about 120° C.

3. The method of claim 2 wherein said barium precursor component is heated at a temperature at or greater than about the melting point thereof.

4. The method of claim 1 wherein said initial film deposition on said substrate is at a temperature of about 750° C., and said continued deposition on said substrate is at a temperature of about 850° C.

5. The method of claim 4 wherein growth of said barium titanate film is at a rate of about 150 nm per hour.

6. The method of claim 1 wherein said MOCVD apparatus comprises an external bubbler component and a reactor component, and each said precursor vapor is transported to said reactor component with a carrier gas.

7. A method of using barium titanate film thickness to reduce tensile strain of a barium titanate film, said method comprising:

providing barium (hexafluoroacetylacetonate)$_2$.triglyme.H$_2$O and titanium tetraisopropoxide precursor components, and a substrate;

heating each said precursor component at a pressure sufficient to provide a medium comprising a vapor of each said component, each said component vapor at a concentration and pressure sufficient for chemical reaction;

introducing oxygen to said vapor medium;

deposition and chemical reaction of said vapor medium components on said substrate to provide an epitaxial barium titanate film thereon, said film having a first thickness dimension and comprising an a-domain structure and a first tensile strain; and continued said deposition and chemical reaction to provide said epitaxial barium titanate film having a second thickness dimension and comprising a mixed a- and c-domain structure and a second tensile strain, said second tensile strain relaxed by comparison with said first tensile strain;

wherein two theta peak is split having peaks at 2θ=45.02° for (002) c-domain and 2θ=45.13° for (200) a-domain when the thickness of said epitaxial barium titanate film is about 500 nm, and an intensity of said peak at 2θ=45.02° is greater than that of said peak at 2θ=45.13°;

wherein said epitaxial barium titanate film has a ratio of volume fractions of the a-domain and c-domain being 57:43 (%); and wherein said epitaxial barium titanate film has a root mean square roughness substantially between 0.4 nm to 1.8 nm.

8. The method of claim 7 wherein said barium precursor component is heated at a temperature less than about 120° C.

9. The method of claim 8 wherein said barium precursor component is heated at a temperature at or greater than about 103° C., said temperature sufficient to provide a stable vapor pressure without oligomerization of said precursor component.

10. The method of claim 7 wherein said initial film deposition on said substrate is at temperature of about 750° C., and said continued deposition on said substrate is at temperature of about 850° C., said initial and continued deposition providing two-stage growth process.

11. The method of claim 10 wherein said two-stage growth process enhances barium titanate film crystallinity and reduces surface roughness.

12. The method of claim 9 wherein growth of said barium titanate is about 150 nm per hour.

13. The method of metal-organic chemical vapor deposition, said method comprising:

providing barium (hexafluoroacetylacetonate)$_2$.triglyme.H$_2$O and titanium tetraisopropoxide precursor components, and a substrate in an MOCVD apparatus comprising an external bubbler component and a reactor component, said substrate in said reactor component;

heating each said precursor component at a pressure sufficient to provide a vapor of each said component;

transporting each said precursor vapor to said reactor component with a carrier gas generated by said apparatus;

introducing oxygen to said precursor vapors;

deposition and chemical reaction of said vapor medium components on said substrate to provide an epitaxial barium titanate film on said substrate, said film having a first thickness dimension and comprising an a-domain structure; and continued said deposition and chemical reaction to provide said epitaxial barium titanate film having a second thickness dimension and comprising a mixed a- and c-domain structure;

wherein two theta peak is split having peaks at 2θ=45.02° for (002) c-domain and 2θ=45.13° for (200) a-domain when the thickness of said epitaxial barium titanate film is about 500 nm, and an intensity of said peak at 2θ=45.02° is greater than that of said peak at 2θ=45.13°;

wherein said epitaxial barium titanate film has a ratio of volume fractions of the a-domain and c-domain being 57:43 (%), and wherein said epitaxial barium titanate film has a root mean square roughness substantially between 0.4 nm to 1.8 nm.

14. The method of claim 13 wherein said barium precursor component is heated at a temperature less than about 120° C.

15. The method of claim 14 wherein said barium precursor component is heated at a temperature at or greater than about the melting point thereof.

16. The method of claim 13 wherein said initial film deposition on said substrate is at a temperature of about 750° C., and said continued deposition on said substrate is at a temperature of about 850° C.

17. The method of claim 16 wherein growth of said barium titanate film is at a rate of about 150 nm per hour.

18. A method of metal-organic chemical vapor deposition (MOCVD), said method comprising:
providing barium(hexafluoroacetylacetonate)$_2$.triglyme.H$_2$O and titanium tetraisopropoxide precursor components, and a substrate in an MOCVD apparatus;
heating each said precursor component at a pressure sufficient to provide a medium comprising a vapor of each said component, each said component vapor at a concentration and pressure sufficient for chemical reaction;
introducing oxygen to said vapor medium;
deposition and chemical reaction of said vapor medium components on said substrate to provide an epitaxial barium titanate film on said substrate, said film having a first thickness dimension and comprising an a-domain structure; and
continued said deposition and chemical reaction to provide said epitaxial barium titanate film having a second thickness dimension and comprising a mixed a- and c-domain structure, said deposition without molecular oligomerization of said barium precursor component to provide said component vapor concentration and pressure sufficient for said chemical reaction;
wherein two theta peak is split having peaks at 2θ=45.02° for (002) c-domain and 2θ=45.13° for (200) a-domain when the thickness of said epitaxial barium titanate film is about 500 nm, and an intensity of said peak at 2θ=45.02° is greater than that of said peak at 2θ=45.13°;
wherein said epitaxial barium titanate film has a ratio of volume fractions of the a-domain and c-domain being 57:43 (%); and
wherein said epitaxial barium titanate film has a root mean square roughness substantially between 0.4 nm to 1.8 nm.

19. The method of claim 18 wherein said barium precursor component is heated at a temperature less than about 120° C.

20. The method of claim 18 wherein said initial film deposition on said substrate is at a temperature of about 750° C., and said continued deposition on said substrate is at a temperature of about 850° C.

21. The method of claim 1 wherein said epitaxial barium titanate film comprising the mixed a- and c-domain structure has a thickness of greater than 300 nm, the thickness being the second thickness dimension.

22. The method of claim 21 wherein the thickness of said epitaxial barium titanate film is about 500 nm.

* * * * *